US012726108B2

(12) United States Patent
Dick et al.

(10) Patent No.: US 12,726,108 B2

(45) Date of Patent: Sep. 1, 2026

(54) ARRANGEMENT AND METHOD FOR DISCHARGING A DC LINK CAPACITOR

(71) Applicant: Hanon Systems, Daejeon (KR)

(72) Inventors: Andreas Dick, Gummersbach (DE); Stefan Tydecks, Cologne (DE)

(73) Assignee: Hanon Systems, Daejeon (KR)

( * ) Notice: Subject to any disclaimer, the term of this patent is extended or adjusted under 35 U.S.C. 154(b) by 570 days.

(21) Appl. No.: 18/003,362

(22) PCT Filed: Nov. 30, 2021

(86) PCT No.: PCT/KR2021/017870

§ 371 (c)(1),
(2) Date: Dec. 27, 2022

(87) PCT Pub. No.: WO2022/119278

PCT Pub. Date: Jun. 9, 2022

(65) Prior Publication Data

US 2023/0318444 A1 Oct. 5, 2023

(30) Foreign Application Priority Data

Dec. 2, 2020 (DE) ..................... 10 2020 131 953.3
Sep. 2, 2021 (DE) ..................... 10 2021 122 687.2

(51) Int. Cl.
*H02M 1/32* (2007.01)
*B60L 3/00* (2019.01)
(Continued)

(52) U.S. Cl.
CPC ............... *H02M 1/322* (2021.05); *H02J 7/80* (2026.01); *H02J 7/933* (2026.01); *B60L 3/003* (2013.01);
(Continued)

(58) Field of Classification Search
CPC ........ H02M 1/322; H02M 1/36; H02J 7/0047; H02J 7/00712; H02J 2310/48; H02J 7/007;
(Continued)

(56) References Cited

U.S. PATENT DOCUMENTS 9,991,783 B2 6/2018 Voegele
2010/0027304 A1 2/2010 Wang et al.
(Continued)

FOREIGN PATENT DOCUMENTS

DE 102008010978 A1 8/2009
DE 102012100951 A1 8/2013
(Continued)

OTHER PUBLICATIONS

A. Bilotti, "Operation of a MOS transistor as a variable resistor," in Proceedings of the IEEE, vol. 54, No. 8, pp. 1093-1094, Aug. 1966 (Year: 1966).*

*Primary Examiner* — Julian D Huffman
*Assistant Examiner* — Lisa Kotowski
(74) *Attorney, Agent, or Firm* — Shumaker, Loop & Kendrick, LLP; James D. Miller

(57) ABSTRACT

An arrangement and a method for discharging a DC link capacitor, is based on the object of specifying a solution with which the DC link capacitor is discharged to values below the safety extra-low voltage within a specified time in the event of a hazard or malfunction, for example, if the high-voltage supply is disconnected or interrupted, and with which the lowest possible power loss results from the arrangement during normal operation. This object is achieved by the arrangement in that the means which discharges the DC link capacitor is a controllable discharge means which is constructed from a series circuit of a discharge resistor and a controllable resistor, and wherein
(Continued)

the controllable discharge means is arranged parallel to the DC link capacitor.

6 Claims, 5 Drawing Sheets

(51) Int. Cl.
*G01R 1/20* (2006.01)
*H02J 7/80* (2026.01)
*H02J 7/90* (2026.01)
*H02J 105/37* (2026.01)

(52) U.S. Cl.
CPC ............. *B60L 3/0046* (2013.01); *G01R 1/203* (2013.01); *H02J 2105/37* (2026.01)

(58) Field of Classification Search
CPC ....... B60L 3/003; B60L 3/0046; G01R 1/203; Y02T 10/72; H02H 7/122
See application file for complete search history.

(56) References Cited

U.S. PATENT DOCUMENTS

2017/0355267 A1* 12/2017 Zhou ....................... B60L 50/10
2019/0195962 A1* 6/2019 Mustonen ............. G01R 31/42
2022/0029526 A1* 1/2022 Denk ...................... H02M 1/32

FOREIGN PATENT DOCUMENTS

DE 102016222632 A1 5/2018
DE 102018208292 A1 8/2019
JP H09163756 A 6/1997
JP 2016082545 A 5/2016
JP 2020022259 A 2/2020
KR 20160122351 A 10/2016
WO WO-2011085838 A1 * 7/2011 ............. H02M 1/32
WO 20170217036 A1 12/2017
WO 2018219643 A1 12/2018

* cited by examiner

ARRANGEMENT AND METHOD FOR DISCHARGING A DC LINK CAPACITOR

CROSS REFERENCE TO RELATED PATENT APPLICATIONS

This is a U.S. national phase patent application of PCT/KR2021/017870 filed Nov. 30, 2021 which claims the benefit of and priority to German Pat. Appl. No. 10 2021 122 687.2 filed on Sep. 2, 2021 and German Pat. Appl. No. 10 2020 131 953.3 filed on Dec. 2, 2020, the entire contents of each of which are incorporated herein by reference.

TECHNICAL FIELD

The invention relates to an arrangement for discharging a DC link capacitor, in which a means which discharges the DC link capacitor is arranged parallel to the DC link capacitor.

The invention also relates to a method for discharging a DC link capacitor, in which a DC link capacitor is at least partially discharged for safety reasons.

In particular, the present invention relates to an arrangement for discharging a DC link capacitor used in vehicles in which direct voltages in the range of greater than or equal to 60 volts are used to operate electrical assemblies. This is the case for example with inverters used in vehicles. Such inverters can also be used in vehicles with a so-called hybrid drive.

BACKGROUND ART

It is known that inverters convert an input-side direct voltage into an output-side al-ternating voltage with which an electric motor, for example, is operated. This allows controlled operation of an electric motor, which can be, for example, a permanent magnet synchronous motor which is used in an electric refrigerant compressor in a vehicle.

The task of such an inverter consists in, for example, actuating or controlling the electric drive motor in the refrigerant compressor of the vehicle and in this manner determining both the rotation speed and the torque of the electric drive motor in the refrigerant compressor by controlling the motor phase currents.

A very widespread circuit arrangement for the controlled actuation of electric drives by means of an inverter is a so-called B6 bridge or B6 bridge circuit.

The B6 bridge comprises three half-bridges, each consisting of a high-side circuit breaker and a low-side circuit breaker. Within a half-bridge, a terminal of the high-side circuit breaker is directly connected to a terminal of the low-side circuit breaker and an output of the half-bridge or the inverter. Via this output, the voltage generated by the half-bridge is output to a phase (X or Y or Z), for example to operate a connected electric motor.

In such a conventional circuit arrangement, a so-called DC link capacitor, which is also referred to as a DC link capacitance, is connected to the input-side direct voltage, for example the terminals or potentials HV+ and HV−, and parallel to the half-bridges of the inverter.

Generally, such a DC link capacitor or the DC link capacitance consists of multiple capacitor elements or capacitors, such as film capacitors or electrolyte capacitors, which are connected parallel to one another in order to provide a resultant DC link capacitor with a higher capacitance value. As is known, the capacitance values of the capacitor elements or capacitors in the parallel circuit add up and in total produce the capacitance value of the resultant DC link capacitor.

In addition to this parallel circuit of the capacitor elements or capacitors, it is also possible to arrange capacitor elements or capacitors additionally in a series circuit. By means of such an additional series circuit of the capacitor elements or capacitors, the total voltage can be distributed via the resultant DC link capacitor to the capacitor elements or capacitors arranged in the series circuit, as a result of which the dielectric strength requirements of the capacitor elements or capacitors are reduced. Only the term DC link capacitor is used below for the terms capacitor elements or capacitors.

For example, safety interlocks are used in electrically driven vehicles with high-voltage applications (>60 VDC). The task of such a safety interlock consists in monitoring the operating state of a high-voltage circuit to which the high-voltage components are connected and in particular checking whether all the plugs or plug connections of such a high-voltage circuit are securely plugged in or fastened.

In a high-voltage circuit of an electric refrigerant compressor, therefore, secure fastening of the plugs or plug connections is checked before the high voltage (>60 VDC) can be switched on. Such a check can be carried out both for one plug or plug connection and for multiple plugs or multiple plug connections. If a disconnection of the connection in the high-voltage circuit is detected, the DC link capacitor must be discharged or at least partially discharged as quickly as possible to prevent dangers to health and life, for example of service personnel during maintenance or repair.

For example, it is necessary for safety reasons to discharge the DC link capacitor, which has a very high nominal capacitance value, in a high-voltage inverter when the high-voltage supply is interrupted, for example when a plug in the high-voltage circuit is disconnected or pulled out, so that the electrical energy stored therein does not cause an electric shock or negatively affect the health of a person.

It is usually required for the voltage at the DC link capacitor to fall to a voltage of 60 VDC or less in order to meet the safety requirements. The time specified for such a fall in the voltage at the DC link capacitor depends on customer requirements, for example, and usually lies within a range of approximately 5 seconds.

A first variant for discharge of a DC link capacitor according to the prior art consists in so-called active discharge. In this case, for example in a vehicle, a check must be carried out by means of a device provided for this purpose as to whether the high-voltage supply is connected in compliance with regulations. This means, for example, that a high-voltage plug is plugged properly by way of its high-voltage line into a corresponding high-voltage mating plug connector of an inverter and is thus connected electrically conductively to same to transmit a high voltage. According to the prior art, this is usually implemented by means of an interlock connection or interlock loop.

If a connection interruption, for example by removal of the high-voltage plug from the high-voltage mating plug connector, is detected, a corresponding arrangement must ensure prompt discharging of the DC link capacitor. This can be achieved by a switching means being actuated and in this manner a discharge resistor being connected parallel to the DC link capacitor, via which discharge resistor the DC link capacitor discharges. A major disadvantage of this method of active discharge consists in that the arrangement for active discharge with its switching means needs a reliable control signal to effect the active discharge. Moreover, an arrangement for active discharge must be provided. In the event that an interruption in the interlock is not detected for whatever reason, the active discharge routine can fail, and the device remains in an unsafe state. This can occur, for example, in a situation where the communication between the arrangement for active discharge and a central control unit such as a microcontroller is interrupted, or the microcontroller is not working because a software error has occurred or a voltage at the microcontroller such as a supply voltage has failed.

One alternative consists in so-called passive discharge according to the prior art. In this case, discharge is achieved by means of a resistor which is connected parallel to the DC link capacitor.

SUMMARY

A significant disadvantage of passive discharge according to the prior art lies in the high power loss of the discharge resistor arranged continuously parallel to the DC link capacitor, which results during so-called normal operation of an inverter, that is, with the high-voltage source connected. This power falls continuously and thus reduces the efficiency of a high-voltage inverter, for example, and results in waste heat, which must be dissipated.

A disadvantage of active discharge consists in that it requires monitoring of the high-voltage plug or a high-voltage line by means of a so-called "interlock", for example, and corresponding communication about the correct operation of the high-voltage circuit with a microcontroller, for example, which must be equipped with corresponding peripheral hardware. Moreover, very reliable software is necessary.

There is thus a need to improve an arrangement and a method for discharging a DC link capacitor.

The object of the invention consists in specifying an arrangement and a method for discharging a DC link capacitor with which the DC link capacitor is discharged to values below a voltage of 60 VDC within a specified time of approximately 5 seconds or less in the event of a hazard or malfunction, for example if the high-voltage supply is disconnected or interrupted, and with which the lowest possible power loss results from the arrangement during normal operation.

The object is achieved by an arrangement for discharging a DC link capacitor having the features as shown and described herein.

The object is also achieved by a method for discharging a DC link capacitor as shown and described herein.

It is provided for passive discharging of the DC link capacitor to take place in the event of a hazard, for example if the high-voltage supply is disconnected or interrupted, and for a controllable discharge means to be arranged parallel to the DC link capacitor to be discharged. The controllable discharge means comprises a discharge resistor and a controllable resistor, which are arranged in a series circuit. The controllable resistor is implemented as a circuit breaker, for example.

It is provided for a MOSFET (metal-oxide-semiconductor field-effect transistor) or an IGBT (insulated-gate bipolar transistor), the resistance of which can be changed by a suitable control signal, to be used as the circuit breaker.

The controllable discharge means or the circuit breaker arranged in same is controlled such that the circuit breaker has a high resistance value during normal operation of the arrangement as an inverter in which the DC link capacitor operates.

In the event of a hazard or malfunction in which the high-voltage circuit is interrupted, the controllable discharge means or the circuit breaker arranged in same is controlled such that the circuit breaker has a low resistance value.

Therefore, a low continuous power loss of the arrangement for discharging a DC link capacitor is achieved during normal operation, while it is possible in the event of a malfunction to discharge the DC link capacitor as quickly as possible and reduce the voltage at the DC link capacitor as quickly as possible to a voltage value which no longer presents any danger to health and life.

In contrast to the active discharge from the prior art, neither an interlock signal nor communication between a vehicle, for example, and the arrangement for discharging a DC link capacitor is needed. Therefore, a functional microcontroller and corresponding software are not necessary either. Monitoring of the functioning of the high-voltage circuit can be omitted.

It is also provided for the DC link capacitor to be discharged by the arrangement for discharging a DC link capacitor also in the event that a voltage supply, such as a low-voltage supply in a vehicle, has failed.

It is also provided for the arrangement for discharging a DC link capacitor to be adaptable to the requirements of customers or OEMs in terms of specified times for discharging the DC link capacitor and in terms of power losses to be achieved, by the use of a controllable discharge means.

It is likewise provided for a part or a partial circuit of the arrangement for discharging a DC link capacitor to monitor the high voltage and to control the controllable resistor or circuit breaker in the controllable discharge means. The total resistance of the controllable discharge means connected parallel to the DC link capacitor is influenced in this way.

The partial circuit of the arrangement for discharging a DC link capacitor controls the controllable resistor or the circuit breaker such that the highest possible total resistance ensures low power losses during operation.

The partial circuit of the arrangement for discharging a DC link capacitor controls the controllable resistor or the circuit breaker such that the lowest possible total resistance is set in the event of a malfunction when the high-voltage circuit is interrupted, in order to allow fast discharge of the DC link capacitor.

In a first circuit variant, it is provided for discharge of the DC link capacitor in the event of a malfunction to take place with a constant current.

In a second circuit variant, it is provided for discharge of the DC link capacitor in the event of a malfunction to take place by means of a switchover such that, when the high voltage falls to a specified threshold, a switchover is made from a low discharge current to a high discharge current.

In a third circuit variant, it is provided for discharge of the DC link capacitor in the event of a malfunction to take place by controlling the discharge power depending on the value of the remaining high voltage. In this case, it is also provided for the discharge current to increase as the high voltage falls.

The discharge power results, for example when a MOSFET circuit breaker is used, from the product of the voltage drop across the drain-source section of the circuit breaker and the discharge current, which corresponds to the discharge current , plus the power loss at other components, such as the resistors, which belong to the discharge circuit.

In a fourth circuit variant, it is provided for discharge of the DC link capacitor in the event of a malfunction to take place by controlling the discharge power depending on the slope of the remaining high voltage.

The most significant advantage of the invention can be achieved with a circuit breaker which is controlled by the gradient of the falling high voltage.

The above-described solutions in the different stages of expansion of an arrangement for discharging a DC link capacitor ensure that safe discharge of the DC link capacitance is guaranteed while at the same time the power loss arising during normal operation is minimized. As a result, thermal problems are reduced, and comparatively small and inexpensive components can be used, resulting in reduced manufacturing costs. There are no costs for cooling means such as heat sinks in the arrangement for discharging a DC link capacitor.

As the power loss decreases, the efficiency of an arrangement for discharging a DC link capacitor increases. In the case of use in electric vehicles, for example, the range of one battery charge can thus be increased.

BRIEF DESCRIPTION OF DRAWINGS

Further details, features and advantages of embodiments of the invention can be found in the description of exemplary embodiments below with reference to the associated drawings. In the figures.

DESCRIPTION OF AN EMBODIMENT

Figure 1:
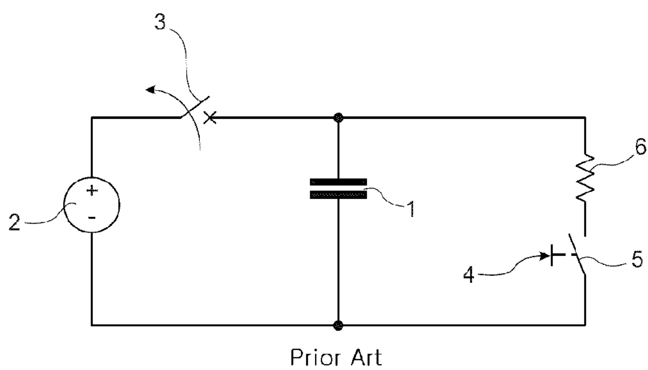
FIG. 1: shows an arrangement for active discharge of a DC link capacitor according to the prior art.

FIG. 1 shows an arrangement for active discharge of a DC link capacitor 1 according to the prior art. A high-voltage source 2 is connected to a DC link capacitor 1, which is arranged, for example, in an inverter (not shown in FIG. 1). For the case in which this current supply of the inverter or of another load connected to the high-voltage source 2 is interrupted, the interruption 3 is shown. This interruption 3 of the high-voltage circuit can be caused, for example, by disconnection of a high-voltage plug or a defect in the high-voltage line. In such a case, the DC link capacitor 1 must be discharged quickly for safety reasons.

In the example of FIG. 1, the interruption 3 is detected according to the prior art by means of an interlock connection or interlock loop used. As a result of the detection of the interruption 3 of the high-voltage circuit, a control signal 4 is generated, which switches the switching means 5. After the switching means 5 is switched on, the DC link capacitor 1 is discharged via the switching means 5 and the discharge resistor 6. In this way, the danger from touching lines and contacts carrying high voltage is removed.

Figure 2:
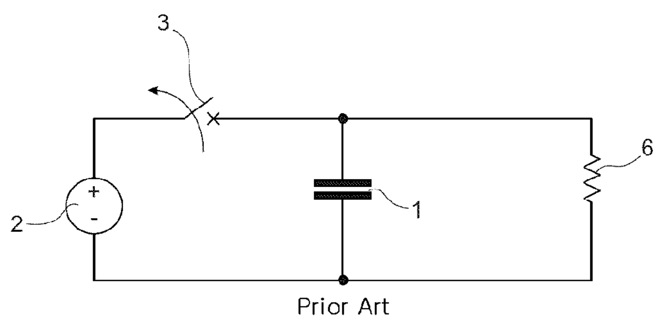
FIG. 2: shows an arrangement for passive discharge of a DC link capacitor according to the prior art.

FIG. 2 shows an arrangement for passive discharge of a DC link capacitor 1 according to the prior art. A high-voltage source 2 is connected to a DC link capacitor 1, which is arranged, for example, in an inverter (not shown in FIG. 2). For the case in which this current supply of the inverter or of another load connected to the high-voltage source 2 is interrupted, the interruption 3 is shown, which can be caused, for example, by disconnection of a high-voltage plug or a defect in the high-voltage line. In this case, the DC link capacitor 1 must be discharged quickly for safety reasons.

In this variant of passive discharge of the DC link capacitor 1, the DC link capacitor 1 is discharged via the discharge resistor 6 arranged parallel to the DC link capacitor 1. In this variant, the high-voltage circuit does not have to be monitored, and a control signal does not have to be generated. Since the discharge resistor 6 is connected parallel to the DC link capacitor 1 continuously, power losses occur at the discharge resistor 6 during normal operation in which the high-voltage circuit is not interrupted and a load such as an inverter generates voltages for actuating an electric motor, since a current flows continuously through the discharge resistor.

Figure 3:
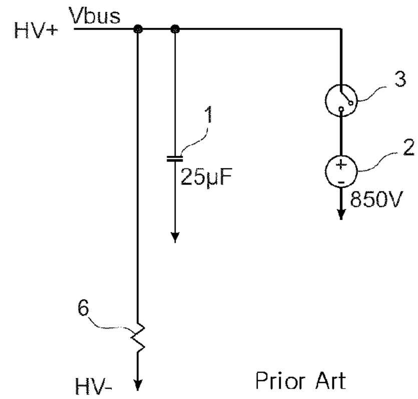
FIG. 3: shows a circuit arrangement for converting and measuring electrical variables during passive discharge of a DC link capacitor.

FIG. 3 shows a circuit arrangement for converting and measuring electrical variables during such passive discharge of a DC link capacitor 1. Since the passive discharge in this arrangement is implemented by means of a simple discharge resistor 6, such discharge of a DC link capacitor 1 of, for example, 25 μF at a high voltage of, for example, 850 volts to a voltage of less than or equal to 60 VDC within, for example, 3 s requires a discharge resistor 6 of approximately 30 kΩ With such dimensioning and a high voltage of, for example, 850 volts in a vehicle, this means a continuous power loss of more than 24 watts, which is implemented continuously at the discharge resistor 6.

FIG. 3 shows the measurement structure with a DC link capacitor 1 of 25 μF with a discharge resistor 6 of 30 kΩ connected parallel thereto. In case the interruption 3 is conductive or closed, both components are arranged between the terminals HV+ and HV− of the high-voltage source 2.

Figure 4:
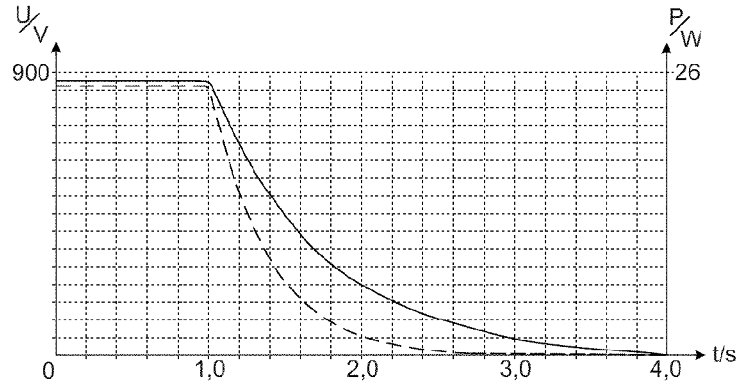
FIG. 4: shows a graph with a curve over time of a high voltage U at the DC link capacitor and a curve over time of the power loss occurring at the discharge resistor.

FIG. 4 shows an associated curve of a high voltage U at the DC link capacitor 1 with a solid line and a curve of the power loss PD occurring at the discharge resistor 6 with a dashed line. The graph shows the voltage U in volts on the left-hand y axis, the power loss P in watts on the right-hand y axis, and the elapsed time tin seconds on the x axis.

As can be seen, if the high-voltage circuit is not interrupted, that is, the interruption 3 is conductive, a high voltage of 850 volts from the high-voltage source 2 is present at the DC link capacitor 1. In this time segment between 0 and 1.0 seconds, a power loss PD of approximately 25 watts occurs at the discharge resistor 6.

At time point t=1.0 seconds, the high-voltage circuit is broken, which is simulated by opening the contacts of the interruption 3. From this time point onwards, the DC link capacitor 1 discharges via the discharge resistor 6. As can be seen in the graph of FIG. 4, approximately 3 seconds pass during this discharge, before the voltage at the DC link capacitor 1 has fallen to a value of approximately 60 volts.

Figure 5:
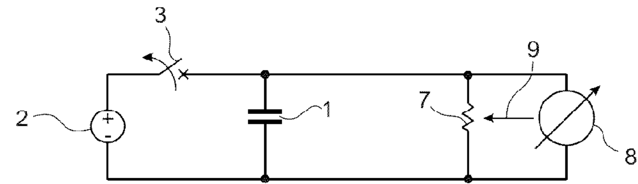
FIG. 5: shows a schematic diagram of an arrangement according to the invention for discharging a DC link capacitor.

FIG. 5 shows a schematic diagram of an arrangement according to the invention for discharging a DC link capacitor 1.

Instead of simply discharging the DC link capacitor 1, which can comprise multiple DC link capacitors, via a fixed discharge resistor 6 (not shown in FIG. 5), it is advantageous to introduce a controllable discharge means 7, the resistance value of which is changed dynamically and adapted to the high voltage. This allows both normal operation and, in the event of a malfunction, discharge of the DC link capacitor 1 which is adapted to the present operating states in the high-voltage circuit. A distinction is made here between the operating states of normal operation of a load such as an inverter with a properly closed high-voltage circuit and a malfunction in a connection and thus an interruption of the high-voltage circuit.

FIG. 5 shows the high-voltage source 2, which is connected to the DC link capacitor 1 during normal operation in which the interruption 3 is conductive or closed. The controllable discharge means 7 according to the invention is arranged in a conventional way in a parallel circuit to the DC link capacitor 1. To monitor the high-voltage circuit or the high voltage present, a voltage-detecting control means 8 is provided, which is likewise arranged in a parallel circuit to the DC link capacitor 1.

The task of the voltage-detecting control means 8 and of the controllable discharge means 7 controlled thereby consists in allowing not only simple, robust and fast passive discharge of the DC link capacitor 1 in the event of a malfunction but also normal operation with low power losses. Therefore, it is provided for the total resistance value of the controllable discharge means 7, which comprises multiple components, to be very high during normal operation in order to minimize the power loss caused by the controllable discharge means 7. It is also provided for the total resistance value of the controllable discharge means 7 to be very low in the event of a malfunction when the high-voltage circuit is interrupted, in order to discharge the DC link capacitor 1 correspondingly quickly.

It is also provided for proper operation with a closed high-voltage circuit to be monitored by means of the voltage-detecting control means 8. This voltage-detecting control means 8 generates a control signal 9 depending on the state of the high-voltage circuit, by means of which control signal the controllable discharge means 7 is controlled and thus changed in total resistance value.

Figure 6:
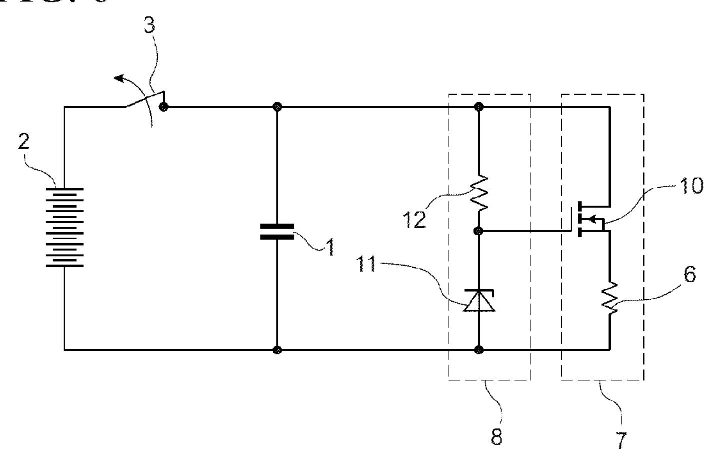
FIG. 6: shows a first circuit variant of an arrangement according to the invention for discharging a DC link capacitor.

FIG. 6 shows a first circuit variant of an arrangement according to the invention for discharging a DC link capacitor 1.

A first variant of an implementation of a controllable discharge means 7 consists in arranging a controllable resistor 10 such as a circuit breaker and a discharge resistor 6 in a series circuit and within a constant current arrangement. This constant current arrangement comprises, in addition to the circuit breaker 10 such as a power MOSFET, a Zener diode 11 and a first resistor 12 connected upstream of the Zener diode 11. In this configuration, the voltage-detecting control means 8 in the series circuit can thus be seen as consisting of the Zener diode 11 and the first resistor 12.

When the high voltage is disconnected, for example by disconnection of a high-voltage plug connection by the high-voltage plug being pulled out, or if there is another undesired interruption of the high-voltage circuit, the DC link capacitor 1 is discharged with a constant current.

This discharging process is calculated according to the formula $$i_D=(V_z-V_g,\ th,\ ps)/R_D \quad [1]$$

Where $V_z$ is the nominal voltage of the Zener diode 11 in volts, $V_{g,th}$,ps is the gate threshold voltage of the circuit breaker 10, and RD is the resistance value of the discharge resistor 6. FIG. 6 also shows the high-voltage source 2 and the interruption 3.

Figure 7:
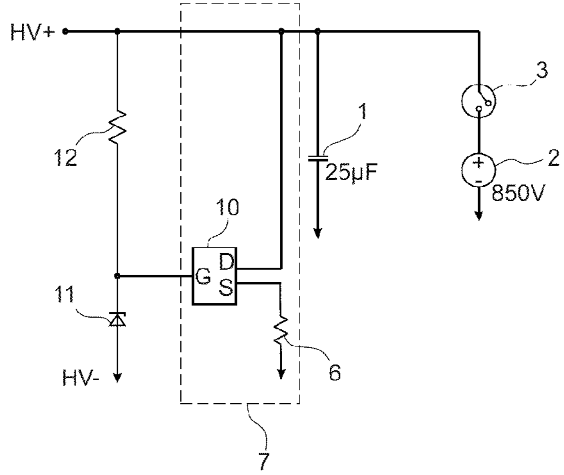
FIG. 7: shows a circuit arrangement for converting and measuring electrical variables during discharge according to the invention of a DC link capacitor.

FIG. 7 shows a circuit arrangement for converting and measuring electrical variables in an arrangement according to the invention for discharging a DC link capacitor 1. The power MOSFET 10 of type STD3NK100Z_V1 shown is connected by its gate terminal to a Zener diode 11 of type BZX84C24VL connected towards potential HV− and to a first resistor 12 with a nominal value of 1680000 ohms, connected towards potential HV+. The source terminal of the power MOSFET 10 is connected to the discharge resistor 6 with a nominal value of 2000 ohms, connected towards potential HV−. The drain terminal of the power MOSFET 10 is connected to potential HV+ of the high-voltage source 2. The controllable discharge means 7 is formed by the power MOSFET 10 and the discharge resistor 6.

In this arrangement, the DC link capacitor 1 has a capacitance of, for example, 25 μF and is connected via the interruption 3 to a high-voltage source with a high voltage of, for example, 850 volts during normal operation.

Figure 8:
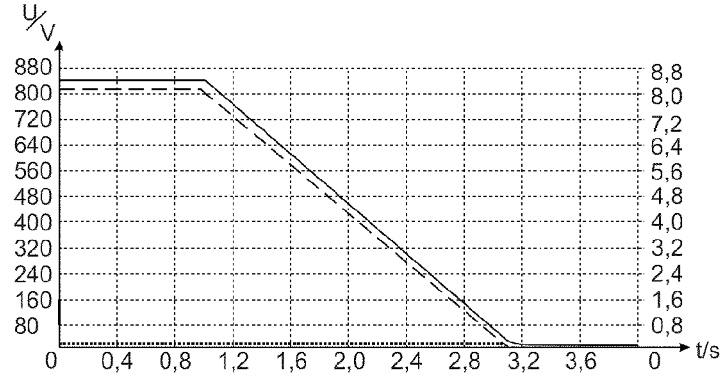
FIG. 8: shows a graph with a curve over time of a high voltage U at the DC link capacitor and a curve over time of the power loss occurring at the discharge resistor for a circuit according to FIG. 7, FIG. 9: shows a second circuit variant of an arrangement according to the invention for discharging a DC link capacitor.

FIG. 8 shows an associated curve of a high voltage U at the DC link capacitor 1 by means of a solid line, a curve of the power loss via the power MOSFET 10 of the arrangement according to FIG. 5 by means of a dashed line, and a curve of the power loss PD occurring only at the discharge resistor 6 by means of a dotted line, during a simulation. The graph shows the voltage U in volts on the left-hand y axis, the power loss P in watts on the right-hand y axis, and the elapsed time tin seconds on the x axis.

At time point t=1.0 seconds, the high-voltage circuit is broken, which is simulated by opening the contacts of the interruption 3 in FIG. 7. From this time point onwards, the DC link capacitor 1 discharges via the drain-source section of the circuit breaker 10 and via the discharge resistor 6, that is, via the controllable discharge means 7. At the time point of approximately 3.0 seconds, the voltage at the DC link capacitor 1 has fallen to a value of approximately 60 volts or lower, as can be seen in the graph of FIG. 8.

As the simulation shows, the DC link capacitor 1 can be discharged within a time of only 2.0 seconds, and it was possible to reduce the power loss occurring at the circuit breaker 10 to approximately 8 watts during normal operation. This corresponds to a reduction in the power loss occurring during normal operation of approximately 70 percent in comparison with a circuit arrangement according to FIG. 2 or FIG. 3.

Figure 9:
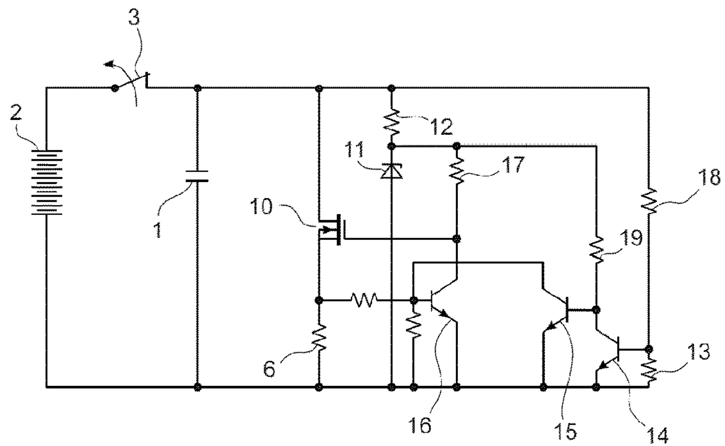

FIG. 9 shows a second circuit variant of an arrangement according to the invention for discharging a DC link capacitor 1.

In an alternative second circuit variant, it is provided for the constant current load to be implemented in a switching manner, so that the discharge current $i_D$ is increased as the high voltage decreases, that is, in the event of a malfunction, and the discharge is thus accelerated. This operating principle is acceptable for a lower high voltage or high bus voltage, since a higher current and a lower high voltage compensate each other in terms of the power loss. In this alternative second circuit variant too, the power loss is thus much lower than in arrangements according to the prior art.

In FIG. 9, a high-voltage source 2 is connected to the DC link capacitor 1 via a closed interruption 3.

As long as the high voltage in the closed high-voltage circuit exceeds a certain value, the voltage drop across the second resistor 13 is large enough to keep the first transistor 14 in a conductive state.

As long as the first transistor 14 is conductive, the second transistor 15 is in a non-conductive state. In this case, the third transistor 16 is through-connected or conductive, and the gate voltage of the circuit breaker 10 acting as the controllable resistor results from the voltage at the Zener diode 11 minus the product of the value of the third resistor 17 and the collector current of the third transistor 16. The transistors 14, 15 and 16 with their corresponding wiring form a voltage-dependent switch, which is in the above-described first switching state when the high voltage is present.

The discharge current of the DC link capacitor 1 in this circuit state is calculated as follows:

$$i_D=(V_z-R_{17}*i_c-V_{g,th,PS})/R_D \quad [2]$$

Where $V_z$ is the nominal voltage of the Zener diode 11 in volts, $V_{g,th,ps}$ is the gate threshold voltage of the circuit breaker 10 in volts, $R_{17}$ is the third resistance 17 in ohms, $i_c$ is the collector current of the third transistor 16 in amperes, and $R_D$ is the resistance value of the discharge resistor 6 in ohms. In this circuit variant too, the controllable discharge means is formed by the circuit breaker 10 and the discharge resistor 6. The circuit part generating the control signal for the gate of the circuit breaker 10 can be referred to as the voltage-detecting control means 8.

For the alternative circuit state in which the high voltage falls below a certain voltage value, because there is, for example, an interruption of the high-voltage circuit in which the interruption 3 is assumed to be open, the first transistor 14 is no longer conductive. The voltage value at which the first transistor 14 should block is defined by the dimensioning of the voltage divider consisting of the second resistor 13 and the fourth resistor 18. In this case, the voltage-dependent switch transfers to its second switching state.

If the first transistor 14 blocks, the second transistor 15 receives, via the fifth resistor 19, a base current which turns on the second transistor 15, and the collector-emitter section of the second transistor 15 becomes low-resistance. As a result, the third transistor 16 blocks. The gate voltage at the circuit breaker 10 then rises to the nominal voltage $V_z$ of the Zener diode 11.

The discharge current $i_D$ of the DC link capacitor 1 in this alternative circuit state increases as follows:

$$i_D=(V_z-V_{g,th,PS})/R_D \quad [3]$$

This alternative circuit state results in an acceleration in the discharging process of the DC link capacitor 1.

The power loss at the circuit breaker 10 is the product of the discharge current $i_D$ and the voltage drop across the source-drain section of the circuit breaker 10 and thus rises at first.

The power loss at the circuit breaker 10 does not reach high values, however, because the high voltage has already fallen to a very low value and continues to decrease before the discharge current $i_D$ becomes high.

It can be assumed of the resistors additionally included in FIG. 9 that their operating principle is known to a person skilled in the art, and therefore any further explanations can be omitted here. FIG. 9 also shows the first resistor 12.

Figure 10:
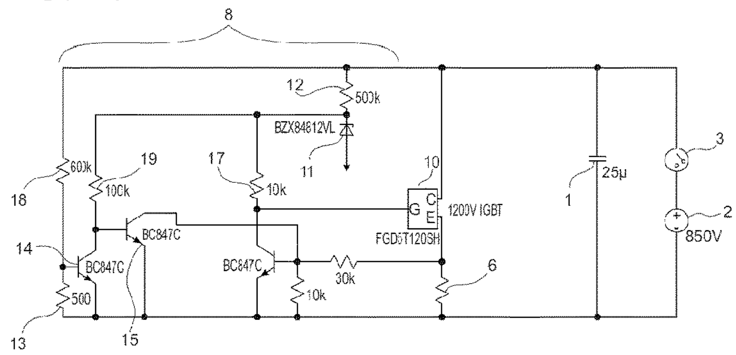
FIG. 10: shows an arrangement according to the invention for discharging a DC link capacitor in a second variant as a measuring circuit.

FIG. 10 shows an arrangement according to the invention for discharging a DC link capacitor 1 in the second circuit variant, which has been implemented in practice to measure electrical variables.

The circuit arrangement shown in FIG. 10 corresponds to the embodiment in FIG. 9, therefore further description of the operating principle is omitted and reference is made to the description of FIG. 9. The difference lies in the specific dimensioning of the components for the measuring arrangement shown.

An IGBT (insulated-gate bipolar transistor) of type FGD5T120SH with a collector-emitter voltage of 1200 volts was used as the circuit breaker 10. The transistors 14, 15 and 16 are of type BC847C, and the Zener diode 11 is of type BZX84B12VL with a Zener voltage between 11.8 volts and 12.2 volts. The DC link capacitor 1 has a capacitance of 25 μF. The high voltage between HV+ and HV− is 850 volts. The values of the resistors used can be found in the diagram of FIG. 10.

Figure 11:
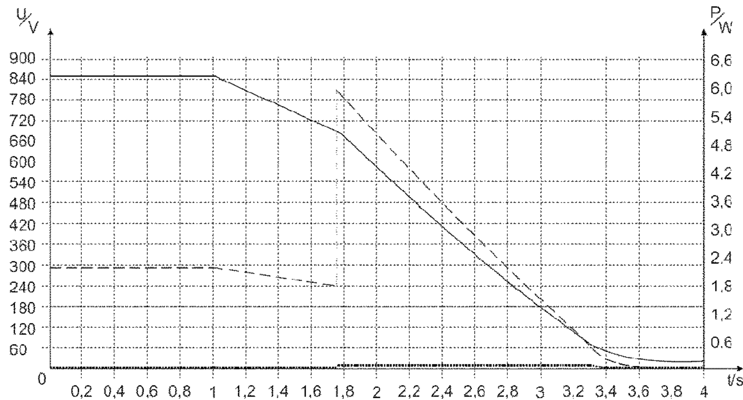
FIG. 11: shows a graph with a curve of a high voltage U at the DC link capacitor and other measurement variables for the arrangement according to FIG. 10, FIG. 12: shows a third circuit variant of an arrangement according to the invention for discharging a DC link capacitor.

FIG. 11 shows an associated curve of a high voltage U at the DC link capacitor 1 by means of a solid line, a curve of the total power loss PG of the arrangement according to FIG. 10 by means of a dashed line, and a curve of the power loss PD occurring only at the discharge resistor 6 by means of a dotted line. The graph shows the high voltage U in volts on the left-hand y axis, the power loss P in watts on the right-hand y axis, and the elapsed time t in seconds on the x axis.

With suitable selection of the threshold after which the discharge current can be increased, very fast discharge and at the same time low continuous power loss are possible.

In FIG. 11, the high voltage has a constant value of approximately 850 volts up to a time point t=1 second. At time point t=1 second, an event occurs, such as the removal of a high-voltage plug, after which the DC link capacitor 1 must be discharged quickly for safety reasons.

Since the circuit arrangement according to FIG. 10 has been in a state with a low discharge current $i_D$ of the DC link capacitor 1 according to formula 2 up until this time point, the high voltage first decreases only at a lower steepness, which can be seen in the graph, within the range between 1.0 and approximately 1.8 seconds.

As a result of the decrease in the high voltage to below the defined voltage value, the arrangement switches into the above-explained alternative circuit state in which the discharge current $i_D$ of the DC link capacitor 1 increases according to formula 3. This switchover moment leads to a brief rise in the total power loss PG of the arrangement according to FIG. 10, which can be seen clearly in the graph of FIG. 11. With the increase in the discharge current $i_D$, the high voltage is reduced more quickly, which can be seen in a curve of the high voltage with greater steepness in the range between approximately 1.8 and approximately 3.4 seconds. At approximately time point t=3.3 seconds, the high voltage reaches the range of less than or equal to 60 volts.

It can also be seen that, when the alternative circuit state is reached, the power loss $P_D$ occurring at the discharge resistor 6 increases slightly but remains in a range well below 0.2 watts.

Figure 12:
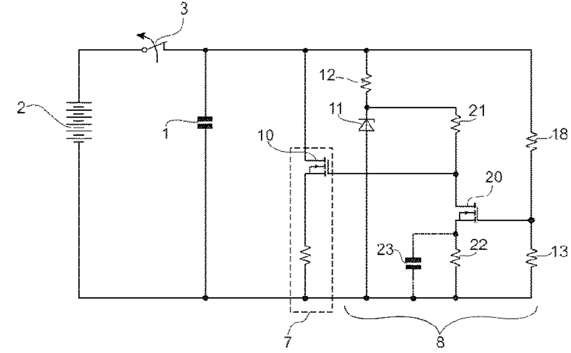

FIG. 12 shows a third circuit variant of an arrangement according to the invention for discharging a DC link capacitor 1.

This third circuit variant is provided to set a passive discharge of the DC link capacitor 1 with the most constant and controlled discharge power possible.

During normal operation, the fourth transistor 20 operates as a current source; the drain current $i_{D,T20}$ of the fourth transistor 20 is calculated as follows $$i_{D,T20} = (V_{R13} - V_{g,T20})/R_{22} \quad [4]$$

Where $V_{R13}$ is the voltage at the second resistor 13 in volts, $V_{g,T20}$ is the gate threshold voltage of the fourth transistor 20 in volts, and $R_{22}$ is the resistance value of the seventh resistor 22 in ohms.

The arrangement for discharging a DC link capacitor also operates as a current source, the discharge current $i_D$ of which is calculated as follows:

$$i_D = (V_{g,PS} - V_{g,th,PS})/R_D \quad [5]$$

Where $V_{g,ps}$ is the voltage at the gate of the circuit breaker 10 in volts, $V_{g,th,ps}$ is the gate threshold voltage of the circuit breaker 10 in volts, and $R_D$ is the resistance value of the discharge resistor 6 in ohms.

The voltage Vg,ps at the gate of the circuit breaker 10 results from the voltage of the Zener diode 11 reduced by the product of the resistance value of the sixth resistor 21 in ohms and the drain current of the fourth transistor 20 in amperes.

Therefore, the following applies for the discharge current $i_D$ $$i_D = (V_z - R_{21} * i_{d,T20} - V_{g,th,PS})/R_D \quad [6]$$

Where $V_z$ is the nominal voltage $V_z$ of the Zener diode 11 in volts, $R_{21}$ is the resistance value of the sixth resistor 21 in ohms, $i_{d,T20}$ is the present drain current of the fourth transistor 20 in amperes, $V_{g,th,ps}$ is the gate threshold voltage of the circuit breaker 10 in volts, and RD is the resistance value of the discharge resistor 6 in ohms.

As the high voltage falls, the voltage across the voltage divider consisting of the second resistor 13 and the fourth resistor 18 and thus also the voltage at the gate of the fourth transistor 20 also fall. The resistance of the drain-source section of the fourth transistor 20 becomes higher, as a result of which the current flow through the sixth resistor 21 and the seventh resistor 22 also decreases.

The voltage at the gate of the circuit breaker 10 thus increases in the direction of the voltage of the Zener diode 11, as a result of which the resistance of the drain-source section of the circuit breaker 10 becomes lower, and the discharge current $i_D$ via the discharge resistor 6 increases.

In an alternative fourth expansion stage, the circuit according to FIG. 12 can be expanded further by an optional second capacitor 23. This ensures that, when the high voltage falls, and therefore when the voltage at the gate of the fourth transistor 20 decreases, the voltage at the source terminal of the fourth transistor 20 initially remains constant. This means that the gate-source voltage of the fourth transistor 20 decreases greatly, and therefore the fourth transistor 20 is transferred to completely blocking operation. As a result, the current through the sixth transistor 21 falls to zero, and the potential at the gate of the circuit breaker 10 is raised to the voltage of the Zener diode 11, so that the discharge current $i_D$ via the discharge resistor 6 rises greatly.

As shown above, the present drain current $i_{d,T20}$ of the fourth transistor 20 falls as the high voltage falls, that is, the discharge current $i_D$ increases as the high voltage falls.

Since the power loss at the circuit breaker 10 is the product of the discharge current $i_D$ and the voltage drop across the drain-source section of the circuit breaker 10, which decreases as the high voltage decreases, the power loss remains approximately constant, since the voltage drop across the drain-source section decreases as the high voltage decreases and the discharge current $i_D$ increases as the high voltage decreases.

In this circuit variant too, the controllable discharge means 7 is formed by the circuit breaker 10 and the discharge resistor 6. The circuit part generating the control signal for the gate of the circuit breaker 10 can be referred to as the voltage-detecting control means 8. FIG. 12 also shows the high-voltage source 2, the interruption 3, the voltage-detecting control means 8 and the first resistor 12.

Figure 13:
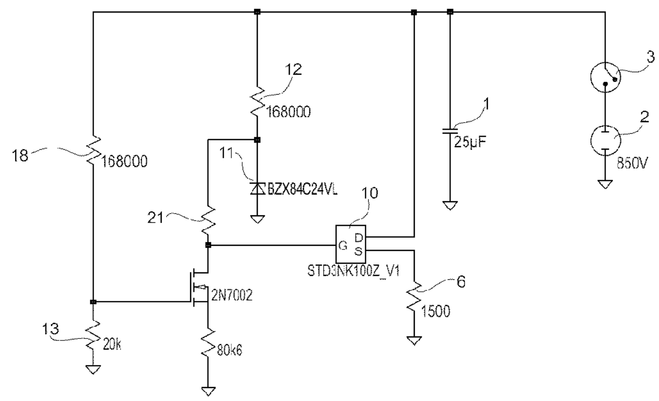
FIG. 13: shows an implementation of the third circuit variant according to FIG. 12 in an experimental arrangement.

FIG. 13 shows an arrangement according to the invention for discharging a DC link capacitor 1 in the third circuit variant according to FIG. 12, which has been implemented in practice as an experimental arrangement to measure electrical variables. In this third circuit variant, passive discharge of the DC link capacitor 1 takes place with a controlled discharge power.

The circuit arrangement shown in FIG. 13 corresponds to the embodiment in FIG. 12, therefore further description of the operating principle is omitted and reference is made to the description of FIG. 12. The difference lies in the specific dimensioning of the components for the measuring arrangement shown.

A transistor of type STD3NK100Z_V1 with a dielectric strength of 1000 volts was used as the circuit breaker 10. The fourth transistor 20 is of type 2N7002, and the Zener diode 11 is of type BZX84C24VL with a Zener voltage between 22.8 volts and 25.6 volts. The DC link capacitor 1 has a capacitance of 25 μF. The high voltage between HV+ and HV− is 850 volts. The values of the resistors used can each be found in the diagram of FIG. 13.

Figure 14:
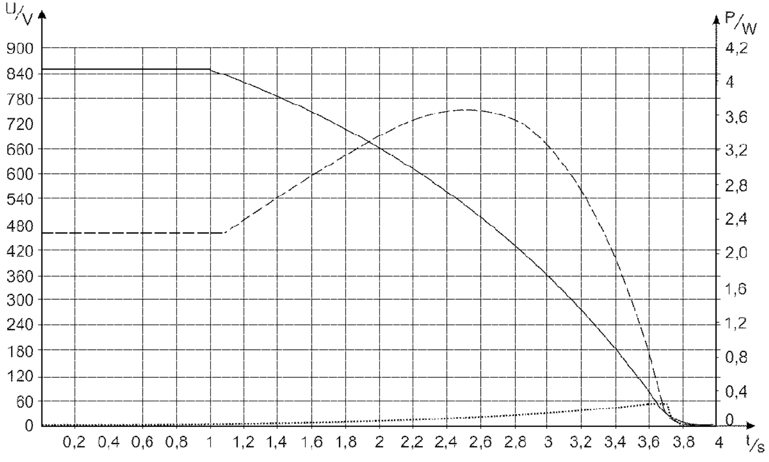
FIG. 14: shows a graph with a curve of a high voltage U at the DC link capacitor and other measurement variables for the arrangement according to FIG. 13, FIG. 15: shows an implementation of the circuit variant according to FIG. 13 in an experimental arrangement.

FIG. 14 shows an associated curve of a high voltage U at the DC link capacitor 1 by means of a solid line, a curve of the power loss $P_{T10}$ at the circuit breaker 10 according to FIG. 13 by means of a dashed line, and a curve of the power loss Pp occurring only at the discharge resistor 6 by means of a dotted line. The graph shows the high voltage U in volts on the left-hand y axis, the power loss P in watts on the right-hand y axis, and the elapsed time t in seconds on the x axis.

The simulation result for the discharge of the DC link capacitor 1 with constant power, according to the arrangement for discharging a DC link capacitor 1 in the third circuit variant shown in FIG. 13, shows that the continuous power loss during normal operation is less than 3 watts, while the individual value of the power loss is dependent on the operating voltage.

Figure 15:
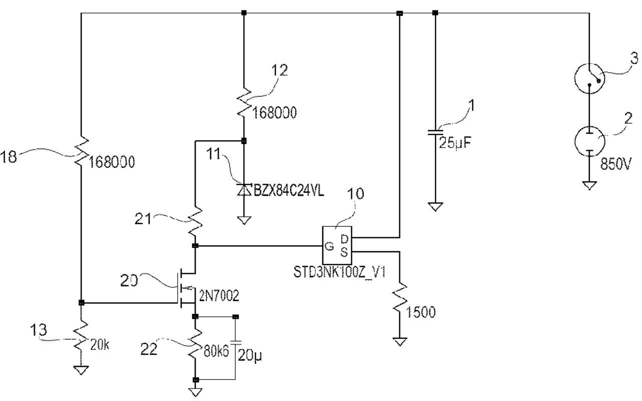

FIG. 15 shows a further arrangement according to the invention for discharging a DC link capacitor 1 in a fourth circuit variant as an experimental arrangement for measuring electrical variables.

This fourth circuit variant is provided to set passive discharge of the DC link capacitor 1 with a constant discharge power.

In this fourth circuit variant, a second capacitor 23 is arranged in addition to the circuit components already known from the experimental construction of FIG. 13. The use of the second capacitor 23 adds a dynamic effect. Since the experimental construction in FIG. 15 substantially corresponds to the experimental construction of FIG. 13, reference is made to the statements made in respect of FIG. 13 above and only the differences are described further.

If the voltage drop across the second resistor 13 decreases when the high voltage falls in the event of a malfunction, the source potential of the fourth transistor 20 remains initially constant owing to the time constant resulting from the seventh resistor 22 and the second capacitor 23.

Depending on the gradient dHV/dt or the curve of the falling high voltage HV, the gate-source voltage of the fourth transistor 20 becomes very low, and therefore the fourth transistor 20 is almost no longer conductive.

This means that the gate voltage at the circuit breaker 10 (PS) jumps to the voltage of the Zener diode 11, and the discharge current $i_D$ is thus calculated as follows $$i_D = (V_z - V_{g,th,ps})/R_D \quad [7]$$

This results in a short power loss pulse at the circuit breaker 10, which accelerates the discharge of the DC link capacitor 1 and thus considerably shortens the discharge time.

In an alternative embodiment, in which the time for the discharge of the DC link capacitor 1 does not have to be shortened, the value of the discharge resistor RD can be selected to be higher, which leads to low continuous power loss during normal operation.

Figure 16:
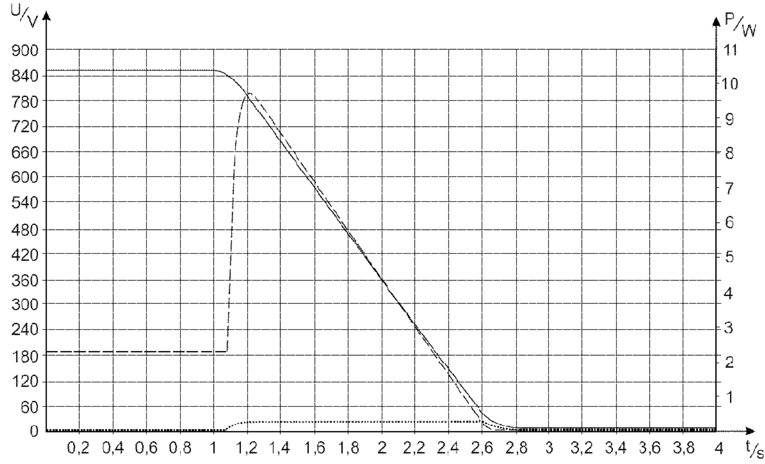
FIG. 16: shows a graph with a curve of a high voltage U at the DC link capacitor and other measurement variables for the arrangement according to FIG. 15, FIG. 17: shows a further implementation of the arrangement according to the invention for discharging a DC link capacitor in a further embodiment implemented as a measuring circuit.

FIG. 16 shows an associated curve of a high voltage U at the DC link capacitor 1 by means of a solid line, a curve of the power loss PT1O at the circuit breaker 10 according to FIG. 15 by means of a dashed line, and a curve of the power loss PD occurring only at the discharge resistor 6 by means of a dotted line. The graph shows the high voltage U in volts on the left-hand y axis, the power loss P in watts on the right-hand y axis, and the elapsed time tin seconds on the x axis.

As can be seen in FIG. 16, the high voltage of approximately 850 volts is present until time point t=1 second. At this moment at t=1 second, a malfunction of a high-voltage line connection and thus an interruption of the high-voltage circuit occur. The DC link capacitor 1 must then be discharged at least partially for safety reasons.

If the graphs of FIG. 14 and FIG. 16 are compared, it can be seen that there is a sudden change in the power loss at the circuit breaker 10. This sudden change occurs when the gradient or voltage gradient dHV/dt occurs and causes the discharge time to be reduced from 2.6 s to 1.5 s.

During operation, the circuit arrangements of FIGS. 15 and 13, which are associated with the graphs of FIGS. 14 and 16, have an approximately equal low continuous power loss. If the time for the discharge of the DC link capacitor 1 does not have to be shortened, the value of the discharge resistor RD can be selected to be higher, which leads to low continuous power loss during normal operation.

Since the pulse load on the circuit breaker 10 is higher in the embodiment of the circuit arrangement according to FIG. 15, the circuit breaker 10 must be dimensioned accordingly.

Since the high pulse load is activated by the voltage gradient dHV/dt, it must be ensured that the discharge circuit is not activated by noise or ripple on the high-voltage line. A capacitor connected to the gate terminal of the circuit breaker 10 ensures reliable operation of the arrangement for discharging a DC link capacitor 1.

Figure 17:
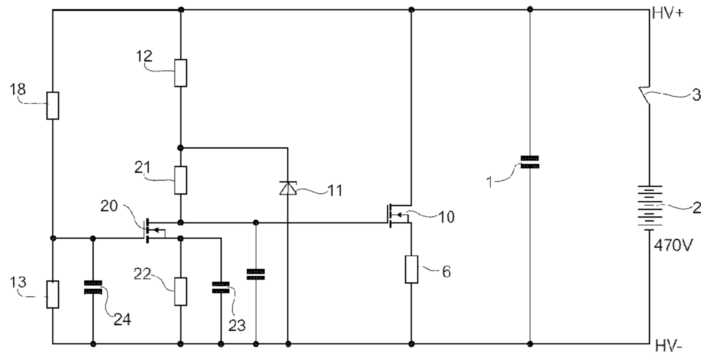

FIG. 17 shows a further implementation of the arrangement according to the invention for discharging a DC link capacitor 1 in an embodiment implemented as a measuring circuit.

The practical implementation, shown in FIG. 17, of an arrangement according to the invention for discharging a DC link capacitor 1 is based on the third circuit variant already shown in FIG. 12. In the embodiment shown in FIG. 17, the second capacitor 23 is arranged parallel to the seventh resistor 22. Moreover, a third capacitor 24 and a fourth capacitor 25 are provided. Whereas the third capacitor 24 is connected to the gate terminal of the fourth transistor 20 and potential HV−, the fourth capacitor 25 is connected to the gate terminal of the circuit breaker 10 and potential HV−.

The high-voltage source 2 shown in FIG. 17 has a voltage of 470 volts.

The use in the inverter of an electric refrigerant compressor for electric or hybrid vehicles is mentioned here as an example of a use of the arrangement according to the invention for discharging a DC link capacitor 1 in the third expansion stage shown. The inverter is operated at 470 V in this example. At the start of the simulation, the high-voltage supply is interrupted by the opening of the interruption 3. By means of the arrangement shown, it is possible to reduce the voltage at the DC link capacitor 1 within 5 seconds such that the voltage is less than or equal to 60 V.

Figure 18:
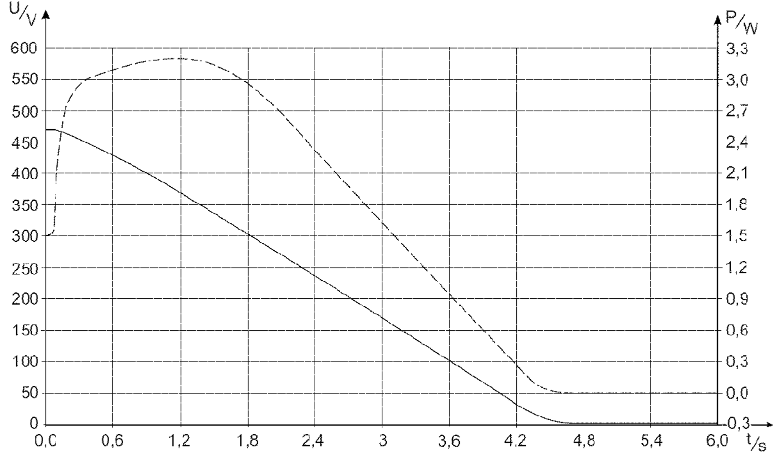
FIG. 18: shows a graph with a curve of a high voltage U at the DC link capacitor and other measurement variables for the arrangement according to FIG. 17.

FIG. 18 shows a curve of a high voltage U at the DC link capacitor 1 with a solid line and a curve of the power loss $P_{T10}$ at the circuit breaker 10 according to FIG. 17 with a dashed line. The graph shows the high voltage U in volts on the left-hand y axis, the power loss P in watts on the right-hand y axis, and the elapsed time tin seconds on the x axis As the simulation shows, the DC link capacitor 1 is able to discharge to a voltage of approximately 60 VDC practically within a time of approximately 4.3 seconds. However, the power loss at the circuit breaker 10 during normal operation, before the interruption 3 opens, is only in a range of approximately 0.5 watts. The total power loss of the arrangement for discharging a DC link capacitor 1 during normal operation for example in a refrigerant compressor is thus only slightly more than 0.5 watts and thus much lower than in the case of the use of a discharge resistor 6 in an arrangement according to the prior art.

List of reference signs

TABLE 1

| | |
|---|---|
| 1 | DC link capacitor |
| 2 | High-voltage source |
| 3 | Interruption/disconnection |
| 4 | Control signal |
| 5 | Switching means |
| 6 | Discharge resistor/$R_D$ |
| 7 | Controllable discharge means |
| 8 | Voltage-detecting control means |
| 9 | Control signal |
| 10 | Controllable resistor/circuit breaker/power MOSFET/PS |
| 11 | Zener diode |
| 12 | First resistor |
| 13 | Second resistor |
| 14 | First transistor |
| 15 | Second transistor |
| 16 | Third transistor |
| 17 | Third resistor |
| 18 | Fourth resistor |
| 19 | Fifth resistor |
| 20 | Fourth transistor |
| 21 | Sixth resistor |
| 22 | Seventh resistor |
| 23 | Second capacitor |
| 24 | Third capacitor |
| 25 | Fourth capacitor |

The invention claimed is:

1. An arrangement for discharging a DC link capacitor, in which a means which discharges the DC link capacitor is arranged parallel to the DC link capacitor, wherein the means which discharges the DC link capacitor is a controllable discharge means which is constructed from a series circuit of a discharge resistor and a controllable resistor, and wherein the controllable discharge means is arranged parallel to the DC link capacitor wherein the controllable discharge means is connected to a voltage-detecting control means which monitors a failure of a high-voltage present at the DC link capacitor, wherein the voltage-detecting control means has at least one Zener diode and a first resistor, wherein there are further arranged in the voltage-detecting control means:

parallel to the DC link capacitor, a voltage divider having a second resistor, a fourth resistor, and a center tap; and a fourth transistor, the gate terminal of which is connected to the center tap of the voltage divider, the source terminal of which is connected via a seventh resistor to the potential HV− of the high-voltage source, and the drain terminal of which is connected to a control input of the controllable resistor and via a sixth resistor and the first resistor to the potential HV+ of the high-voltage source.

2. The arrangement according to claim 1, wherein the controllable resistor is a MOSFET or an IGBT.

3. The arrangement according to claim 1, wherein the voltage-detecting control means has a bistable switching means.

4. An arrangement for discharging a DC link capacitor, in which a means discharging the DC link capacitor is arranged parallel to the DC link capacitor, wherein the means discharging the DC link capacitor by means of a passive discharge is a controllable discharge means, which is constructed from a series circuit of a discharge resistor and a controllable resistor, wherein the controllable discharge means is arranged parallel to the DC link capacitor, wherein the controllable discharge means is connected to a voltage-detecting control means which monitors a failure of a high-voltage present at the DC link capacitor, wherein the voltage-detecting control means has at least one Zener diode and a first resistor, wherein there are further arranged in the voltage-detecting control means:

parallel to the DC link capacitor, a voltage divider having a second resistor, a fourth resistor, and a center tap; and a controllable switch, which has a first transistor connected to the center tap, a second transistor connected to the first transistor, and a third transistor connected to a control input of the controllable resistor.

5. The arrangement according to claim 4, wherein the controllable switch comprises:

the first transistor, the base terminal of which is connected to the center tap, the emitter terminal of which is connected to a potential HV− of the high-voltage source, and the collector terminal of which is connected via a fifth resistor and the first resistor to the potential HV+ of the high-voltage source;

the second transistor, the base terminal of which is connected to the collector terminal of the first transistor, the emitter terminal of which is connected to the potential HV− of the high-voltage source, and the collector terminal of which is connected to a base terminal of the third transistor;

the third transistor, the emitter terminal of which is connected to the potential HV− of the high-voltage source, the base terminal of which is connected via a resistor to the potential HV− of the high-voltage source and to the collector terminal of the second transistor and via a further resistor to the discharge resistor and a source terminal of the controllable resistor, wherein its collector terminal is connected to a control input of the controllable resistor and via a third resistor and the first resistor to the potential HV+ of the high-voltage source.

6. An arrangement for discharging a DC link capacitor, in which a means discharging the DC link capacitor is arranged parallel to the DC link capacitor, wherein the means discharging the DC link capacitor by means of a passive discharge is a controllable discharge means, which is constructed from a series circuit of a discharge resistor and a controllable resistor, wherein the controllable discharge means is arranged parallel to the DC link capacitor, wherein the controllable discharge means is connected to a voltage-detecting control means which monitors a failure of a high-voltage present at the DC link capacitor, wherein the voltage-detecting control means has at least one Zener diode and a first resistor, wherein there are further arranged in the voltage-detecting control means:

parallel to the DC link capacitor, a voltage divider having a second resistor, a fourth resistor, and a center tap; and a fourth transistor, the gate terminal of which is connected to the center tap of the voltage divider and via a third capacitor to the potential HV− of the high-voltage source, the source terminal of which is connected via a seventh resistor and via a second capacitor to a potential HV− of the high-voltage source, and the drain terminal of which is connected to a control input of the controllable resistor and via a sixth resistor and the first resistor to the potential HV+ of the high-voltage source.

* * * * *